US008471736B1

(12) United States Patent
Booth et al.

(10) Patent No.: US 8,471,736 B1

(45) Date of Patent: Jun. 25, 2013

(54) AUTOMATIC ADJUSTING CIRCUIT AND METHOD FOR CALIBRATING VERNIER TIME TO DIGITAL CONVERTERS

(75) Inventors: Richard W. D. Booth, San Jose, CA (US); Koji Takinami, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/441,723

(22) Filed: Apr. 6, 2012

(51) Int. Cl.
*H03M 1/48* (2006.01)

(52) U.S. Cl.
USPC ........... 341/115; 341/120; 341/155; 327/105; 327/158; 327/159; 327/269

(58) Field of Classification Search
USPC .................. 341/115–155; 327/105, 158, 159, 327/269; 331/1 A, 25, 34; 375/219, 316, 375/376
See application file for complete search history.

(56) References Cited

U.S. PATENT DOCUMENTS 6,944,099 B1 * 9/2005 Preuss et al. .................. 368/113
7,205,924 B2 * 4/2007 Vemulapalli et al. ......... 341/166
7,688,242 B2 * 3/2010 Shimizu et al. ............... 341/155
7,710,101 B2 * 5/2010 Narayanan et al. ........ 324/76.39
7,750,305 B2 * 7/2010 Solf et al. ................. 250/363.04
7,791,525 B2 * 9/2010 Rivoir ........................... 341/166
7,884,751 B2 * 2/2011 Shimizu et al. ............... 341/166
7,974,807 B2 * 7/2011 Geng et al. .................... 702/106
8,228,219 B2 * 7/2012 Henzler et al. ................ 341/120

* cited by examiner

*Primary Examiner* — Lam T Mai

(57) ABSTRACT

An automatically calibrating time to digital conversion circuit. The circuit includes a first circuit node for switchably receiving a first calibration signal and a second circuit node coupled with the first circuit node via a first delay path. A third circuit node for switchably receiving a second calibration signal the same as the first calibration signal is coupled with a fourth circuit node via a second delay path. A calibration portion has a third delay path switchably connected with the fourth circuit node and a fourth delay path switchably connected with the second circuit node. The calibration portion generates a delay adjustment signal for adjusting a time delay of the first delay path such that the first time delay combined with the fourth time delay equals the second time delay combined with the third time delay. The calibration portion is disconnected when calibration is not desired for conserving power.

20 Claims, 3 Drawing Sheets

AUTOMATIC ADJUSTING CIRCUIT AND METHOD FOR CALIBRATING VERNIER TIME TO DIGITAL CONVERTERS

BACKGROUND

1. Field

The present invention relates generally to improvements in time to digital conversion circuits and more particularly pertains to automatic calibration circuits for Vernier time to digital converters and improvements thereto.

2. Description of the Related Art

Time to digital conversion is often used in high speed electronic applications for determining the precise phase or timing of a signal utilized by the electronic application circuitry. A time to digital converter is a device or circuit that converts a pulsed signal into a digital representation of the timing of such pulses for circuits that require accurate timing of events. For example, all digital phase locked loops (ADPLL) commonly use a time to digital converter to ensure proper operation. An input signal is sampled via a reference clock at the outputs of a series of inverters or buffers that operate as a delay line along the propagation path of the input signal. This delay of the input signal translates into a phase quantization proportional to the delay and the operating frequency of the input signal. Thus, by decoding the samples of the input signal at the various delays, the phase of the input signal can be determined. A more accurate or precise phase quantization allows for increased accuracy in determining the phase.

Traditional time to digital converters can only quantize the phase component of an input signal roughly, lending to inaccuracies in the precise determination of the phase component of the input signal. In an effort to improve such conversion methods, Vernier time to digital converters have been employed. Similar to the traditional converters, Vernier time to digital conversion circuits utilize an additional delay line disposed along the propagation path of the reference clock for sampling the input signal. The delay line for the reference clock acts faster than the delay line for the input signal. Thus, in a Vernier time to digital converter, the input signal travels through a slower delay path and is sampled by a reference clock signal that travels through a faster delay path. By shifting the rising edge of the reference clock signal due to the faster delay path, improved phase quantization can be obtained compared to traditional time to digital converters. In Vernier circuits, the phase quantization is instead proportional to the difference in the delays between the two delay lines. Maintaining this designed difference in the delays of the two delays lines is critical to proper operation.

Conventional calibration of time to digital conversion circuits is typically performed via elaborate histogram data collecting followed by extensive analysis, often requiring off-board or off-line circuitry or systems. Such calibration is both expensive in time required for such data collection, manipulation and analysis and also in equipment and component manufacturing expense. Furthermore, in conventional calibration, the Vernier time to digital circuit may be difficult to calibrate once installed into or amongst other system circuitry due to the external connections and off-line analysis that is often required. Thus, a method or apparatus for accurately maintaining the ratio of the delays of the two delay lines is desired. The method or apparatus would desirably be capable of providing on-board Vernier time to digital calibration and require a minimum of assumed component operational parameters. The method or apparatus would desirably be capable of automatic calibration without extensive user analysis of data and would be capable of activation only when calibration is needed in order to reduce power consumption or other interference with connected circuits. Furthermore, the method or apparatus would desirably be of minimal increased cost or complexity to the Vernier time to digital conversion circuit.

SUMMARY

An apparatus and method for automatically calibrating a Vernier time to digital conversion circuit is disclosed. In one embodiment, a calibrating time to digital converter may include a first circuit node for receiving a first signal and a first delay path having a first time delay coupled with the first circuit node. A second circuit node is coupled with the first delay path for receiving the first signal after the first time delay. The time to digital converter may also include a third circuit node for receiving a second signal and a second delay path having a second time delay coupled with the third circuit node. A fourth circuit node is coupled with the second delay path for receiving the second signal after the second time delay. A third delay path having a third time delay is switchably coupled with the fourth circuit node for receiving the second signal after the second time delay if the third delay path is coupled with the fourth circuit node and, wherein, the first time delay is configured to be adjusted based on the first time delay, the second time delay and the third time delay.

In another embodiment, an automatic adjusting time to digital conversion circuit may include a first circuit node configured to conduct a first calibration signal, at least one first delay element electrically connected with the first circuit node and configured to delay the first calibration signal by a first time delay and a second circuit node electrically connected with the at least one first delay element and configured to conduct the first calibration signal after the first time delay. A first switch having a conducting configuration and a non-conducting configuration is electrically connected with the second circuit node. The automatic adjusting time to digital conversion circuit may also include a third circuit node configured to conduct a second calibration signal, at least one second delay element electrically connected with the third circuit node and configured to delay the second calibration signal by a second time delay faster than the first time delay and a fourth circuit node electrically connected with the at least one second delay element and configured to conduct the second calibration signal after the second time delay. A second switch having a conducting configuration and a non-conducting configuration is electrically connected with the fourth circuit node. At least one third delay element is electrically connected with the second switch, the at least one third delay element configured to delay the second calibration signal by a third time delay when the second switch is in the conducting configuration. At least one fourth delay element is electrically connected with the first switch, the at least one fourth delay element configured to delay the first calibration signal by a fourth time delay when the first switch is in the conducting configuration. A delay adjustment signal is configured to be received by the at least one first delay element for adjusting the first time delay so that the first time delay added to the fourth time delay equals the second time delay added to the third time delay.

In yet another embodiment, a method of automatically calibrating a time to digital conversion circuit may include the steps of providing a first delay path having a first time delay, the first delay path electrically connected between a first circuit node and a second circuit node, providing a second delay path having a second time delay, the second delay path electrically connected between a third circuit node and a fourth circuit node, switching a third delay path to electrically connect with the fourth circuit node, the third delay path having a third time delay, switching a fourth delay path to electrically connect with the second circuit node, the fourth delay path having a fourth time delay, generating a delay adjustment signal based upon the combination of the first time delay and the fourth time delay and the combination of the second time delay and the third time delay, and calibrating the first time delay of the first delay path based on the delay adjustment signal.

BRIEF DESCRIPTION OF THE DRAWINGS

Other systems, methods, features, and advantages of the present invention will be or will become apparent to one with skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

Figure 1A:
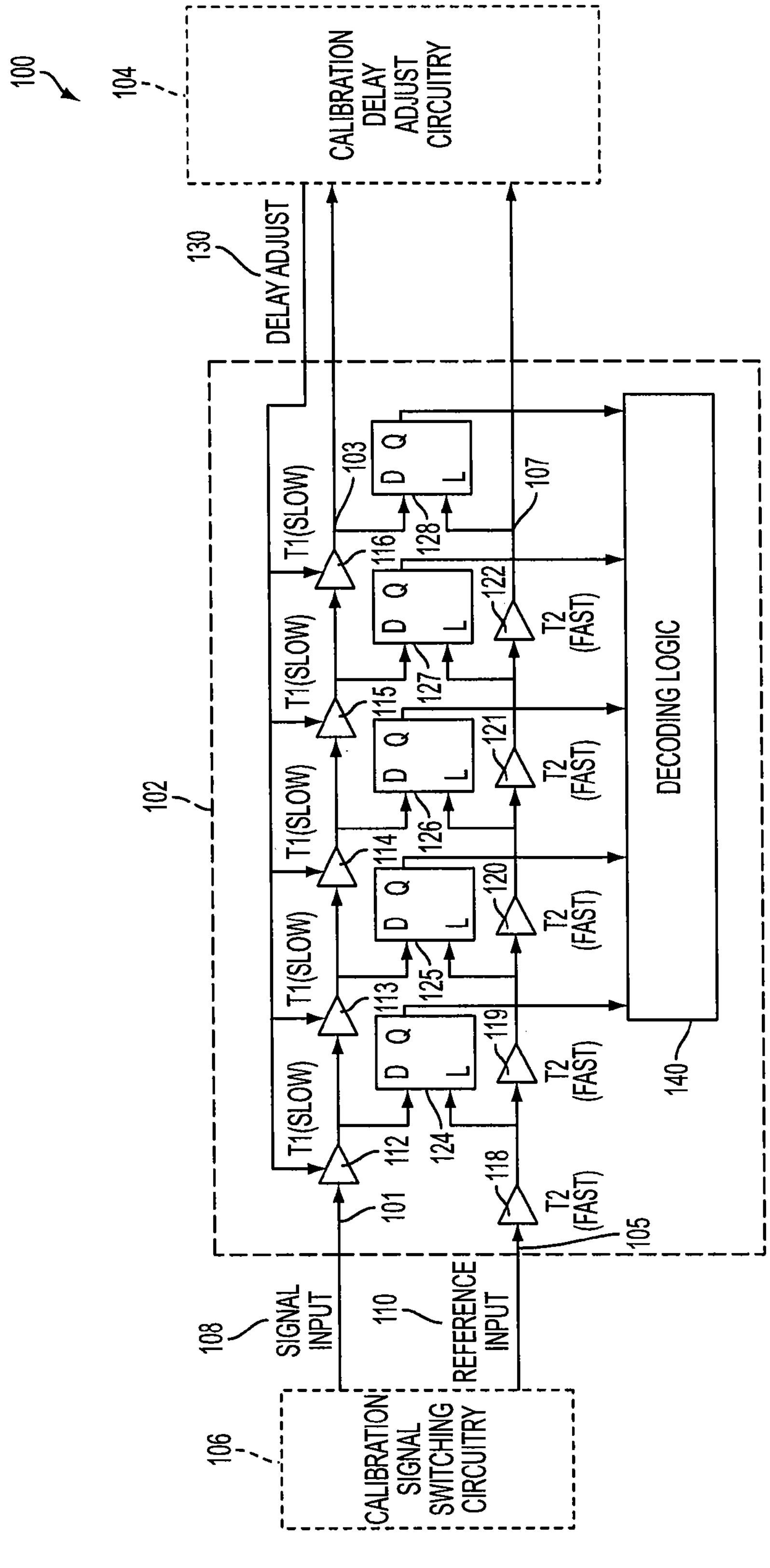
FIG. 1A is a schematic circuit diagram of a time to digital converter configured for automatic calibration by a calibration circuit in accordance with an embodiment of the invention.

In reference to FIG. 1, a schematic circuit diagram 100 is shown incorporating a time to digital circuit configured for automatic calibration by a calibration circuit. The schematic circuit diagram 100 illustrates a circuit for detecting a phase component of an input signal and converting the phase component into a digital representation for use by other connected electronics equipment or systems. The schematic circuit diagram 100 includes a number of different electrical components or devices, such as buffers or inverters, latches and other decoding logic. For illustrative purposes, the schematic circuit diagram 100 will be described with reference to specific configurations of these different electrical components or devices. However, other specific electrical components or configurations may be used to achieve other desired conversion characteristics. It is not required that the exact components or devices described be used in the present invention and such components or devices are used to illustrate various embodiments and not to limit the present invention.

The schematic circuit diagram 100 includes a time to digital portion 102, a calibration portion 104 and a calibration signal switching portion 106. During normal operation, a signal input 108 is transmitted to the time to digital portion 102 and passes through a variety of electrical components for delaying the signal input 108 and for sampling the signal input 108. A first circuit node 101 is configured to receive the signal input 108. The first circuit node 101 is connected to a plurality of signal delay elements (112, 113, 114, 115, 116) that form a signal delay path for the signal input 108. As the signal input 108 conducts down the signal delay path created by the signal delay elements (112, 113, 114, 115, 116), each of the signal delay elements (112, 113, 114, 115, 116) cause a time delay of the signal input 108.

For example, a first signal delay element 112 is coupled with the first circuit node 101. A second signal delay element 113 is coupled with an output of the first signal delay element 112. A third signal delay element 114 is coupled with an output of the second signal delay element 113. A fourth signal delay element 115 is coupled with an output of the third signal delay element 114. A fifth signal delay element 116 is coupled with an output of the fourth signal delay element 115. A second circuit node 103 is coupled with an output of the fifth signal delay element 116. Thus, as the signal input 108 propagates down the signal delay path and through each of the signal delay elements (112, 113, 114, 115, 116), the signal input 108 is delayed by a particular time delay at the output of each of the signal delay elements (112, 113, 114, 115, 116). Each of the signal delay elements (112, 113, 114, 115, 116) is configured to have the same time delay as one another. While five signal delay elements (112, 113, 114, 115, 116) are shown for the schematic circuit diagram 100, greater or fewer delay elements may be used in an alternative embodiment (e.g., the first signal delay element 112 may not be included).

A third circuit node 105 is configured to receive a reference input 110. The reference input 110 provides a clocking signal for sampling of the signal input 108. The third circuit node 105 is connected to a plurality of reference delay elements (118, 119, 120, 121, 122) that form a reference delay path for the reference input 110. As the reference input 110 conducts down the reference delay path created by the reference delay elements (118, 119, 120, 121, 122), each of the reference delay elements (118, 119, 120, 121, 122) cause a time delay of the reference input 110.

Similar to the above, a first reference delay element 118 is coupled with the third circuit node 105. A second reference delay element 119 is coupled with an output of the first reference delay element 118. A third reference delay element 120 is coupled with an output of the second reference delay element 119. A fourth reference delay element 121 is coupled with an output of the third reference delay element 120. A fifth reference delay element 122 is coupled with an output of the fourth reference delay element 121. A fourth circuit node 107 is coupled with an output of the fifth reference delay element 122. Thus, as the reference input 110 propagates down the reference delay path and through each of the reference delay elements (118, 119, 120, 121, 122), the reference input 110 is delayed by a particular time delay at the output of each of the reference delay elements (118, 119, 120, 121, 122).

Each of the reference delay elements (118, 119, 120, 121, 122) is configured to have the same time delay as one another. By sampling the signal input 108 at the output of each of the signal delay elements (112, 113, 114, 115, 116) via the reference input 110, as described in greater detail herein, a digital phase representation can be obtained that is proportional to the time delay of the signal input 108 and to the operating frequency of the reference input 110. In order to improve the quantization of the circuit, the particular time delays of each of the signal delay elements (112, 113, 114, 115, 116) are slower (i.e. greater than) the particular time delays of each of the reference delay elements (118, 119, 120, 121, 122). As shown, the number of reference delay elements (118, 119, 120, 121, 122) equals the number of signal delay elements (112, 113, 114, 115, 116). While five reference delay elements (118, 119, 120, 121, 122) are shown for the schematic circuit diagram 100, greater or fewer delay elements may be used in an alternative embodiment (e.g., the first reference delay element 118 may not be included).

The reference input 110 is used to initiate a sampling of the signal input 108 via a plurality of latches (124, 125, 126, 127, 128) that are connected to both the signal input 108 and the reference input 110 at various points along their respective delay paths. For example, a first latch 124 receives the signal input 108 after it is delayed by the first signal delay element 112 and also receives the reference input 110 after it is delayed by the first reference delay element 118. Upon a transition or passing of a threshold of the reference input 110 received at the first latch 124, the first latch 124 latches or locks the state or value of the signal input 108 received at the first latch 124 and outputs such value to a decoder 140. Similarly, a second latch 125 receives the signal input 108 after it is delayed by both the first signal delay element 112 and the second signal delay element 113. The second latch 125 also receives the reference input 110 after it is delayed by both the first reference delay element 118 and the second reference delay element 119. Upon transition or passing of a threshold of the reference input 110 received at the second latch 125, the second latch 125 latches or locks the state or value of the signal input 108 received at the second latch 125 and outputs such value to the decoder 140. Similar operation occurs for the remaining latches (126, 127, 128), thus generating a binary code or string via the outputs of the latches (124, 125, 126, 127, 128) that is received by the decoder 140. The decoder 140 utilizes decoding logic to interpret this digital or binary code or string for determining a phase of the signal input 108. The digital code indicates the phase of the signal input 108 which is defined by the transition of the signal input 108 from a low (e.g., a 0) to a high (e.g., a 1) or vice versa.

A delay adjust signal 130 is received by each of the signal delay elements (112, 113, 114, 115, 116) for adjusting the time delay of each of the signal delay elements (112, 113, 114, 115, 116). For example, each of the signal delay elements (112, 113, 114, 115, 116) may be a transistor configured to operate as a buffer. By adjusting the current level received at a terminal (e.g., a gate) of each of the transistors, the time delay of the transistor operating as a buffer may be modified. Thus, by adjusting the amount of current of the delay adjust signal 130 that is received at the signal delay elements (112, 113, 114, 115, 116), the time delay of the signal delay math may be correspondingly adjusted. In an alternative embodiment, the delay adjust signal 130 may be received by only a portion of the signal delay elements (112, 113, 114, 115, 116). In still another embodiment, the delay adjust signal 130 may be received by one or more of the reference delay elements (118, 119, 120, 121, 122) instead of or in addition to the signal delay elements (112, 113, 114, 115, 116).

The calibration portion 104 of the schematic circuit diagram 100 provides the delay adjust signal 130, as described in greater detail herein. Moreover, the calibration signal switching portion 106 provides the calibration signal or signals that pass from the first circuit node 101 to the second circuit node 103 and from the third circuit node 105 to the fourth circuit node 107, as described in greater detail herein. The calibration portion 104 includes additional circuitry for determining and generating or adjusting the delay adjust signal 130 and is configured to only connect with the time to digital portion 102 of the schematic circuit diagram 100 when calibration or timing adjustment functionality is desired. When the calibration portion 104 is disconnected from the time to digital portion 102, the time to digital portion 102 may operate nominally without the calibration portion 104 interfering with proper operation or consuming additional power. Similarly, the calibration signal portion 106 is configured to provide a calibration signal to both the first circuit node 101 and the third circuit node 105 only during calibration procedures when the calibration portion 104 is electrically connected with the time to digital portion 102.

A total delay time for either the signal delay path or the reference delay path is shown by the following equation:

$$T_T = N*T$$

where $T_T$ is the total delay time of the delay path, N is the number of delay elements in the delay path and T is the time delay of each of the delay elements. For a traditional time to digital converter where only the signal input 108 propagates through a delay path, the phase quantization is shown by the following equation:

$$\delta\theta = 360°*T*F_S$$

where δθ is the phase range for each phase increment of the signal input 108 and $F_S$ is the frequency of the reference input 110. The delay path covers a predetermined number of degrees of the signal input 108 in accordance with the following equation:

$$X = N*T*F_S*360°$$

where X is the number of degrees of the signal input 108. For example, in a circuit having ten signal delay elements, each with a delay time of 100 ns, and a reference clock of 1 MHz, the full 360 degrees of an input signal would be covered by the delay line. In an alternative embodiment, greater or fewer than 360 degrees of the input signal may be covered. For embodiments covering less than 360 degrees, additional circuitry or acquisition procedures may be required for pushing the input signal into the range of the time to digital converter.

However, such traditional time to digital circuit configurations yield only a rough quantization with a typically large 60 for the signal input 108. By also propagating the reference input 110 along the reference delay path (e.g., faster than the signal delay path) per a Vernier time to digital converter, this time or phase quantization can be greatly improved. Thus, the phase quantization for a Vernier time to digital converter is instead shown by:

$$\delta\theta = 360°*(T_1 - T_2)*F_S$$

where $T_1$ is the delay time of each of the delay elements forming the signal delay path and $T_2$ is the delay time of each of the delay elements forming the reference delay path. Therefore, the time or phase quantization is proportional to the difference in the time delay for a signal path delay element and a reference path delay element. For example, for the schematic circuit diagram 100 having signal delay elements (112, 113, 114, 115, 116) each with a delay time (i.e., $T_1$) of 100 ns, reference delay elements (118, 119, 120, 121, 122) each having a delay time (i.e., $T_2$) of 90 ns and the reference signal 110 having a frequency was 1 MHz, the phase quantization would be 3.6 degrees. If the reference signal 110 did not propagate through any delay path (e.g., as in a traditional time to digital converter), the phase quantization would be a much larger 36 degrees. One example of these phase quantization differences is shown in FIG. 1B, as discussed in greater detail herein.

For proper operation, the difference in total time delay between the signal delay path and the reference delay path must be maintained in order to accurately perform the time to digital conversion. By utilizing calibration delay adjustment circuitry of the calibration portion 104 in combination with calibration signal switching circuitry of the calibration signal switching portion 106, the ratio of the two delay paths can be maintained and only assumes uniformity in the signal delay elements (112, 113, 114, 115, 116) and the reference delay elements (118, 119, 120, 121, 122). By allowing for switching of the time to digital portion 102 to electrically connect with the calibration portion 104 and the calibration signal switching portion 106, any calibration circuitry only need be connected and activated when needed, thus conserving power and allowing normal operation when calibration is not desired.

Figure 1B:
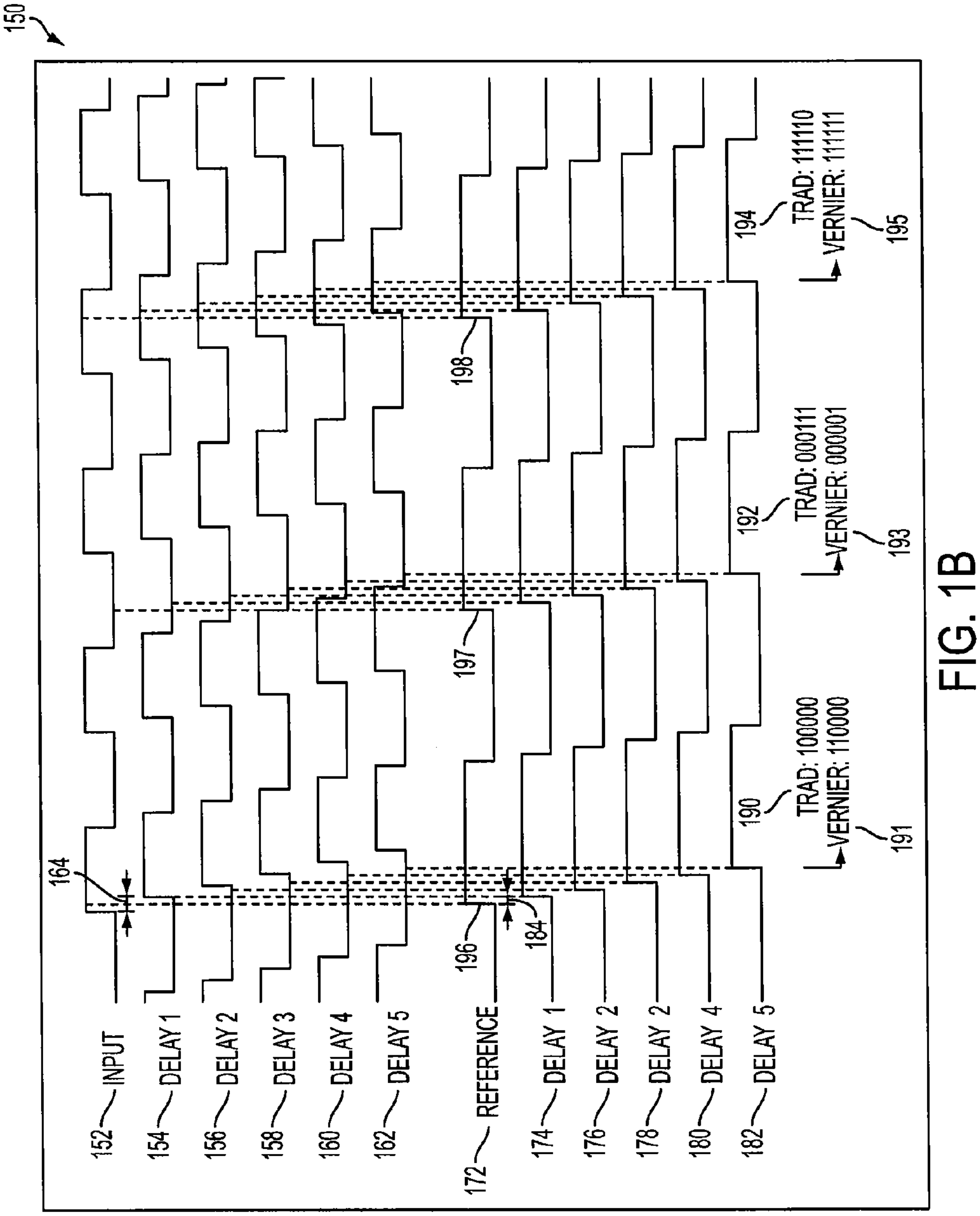
FIG. 1B is a timing diagram of a time to digital converter configured for automatic calibration by a calibration circuit in accordance with an embodiment of the invention.

FIG. 1B shows a timing diagram 150 of a time to digital converter configured for automatic calibration by a calibration circuit. The timing diagram 150 demonstrates the improved quantization when a reference clock is passed through a delay path in addition to an input signal passing through a separate delay path to be sampled. A signal input 152 is shown versus time. The signal input 152 may be the same or similar to the signal input 108 of FIG. 1A. A first delayed signal input 154 is shown versus time and corresponds to the signal input 152 delayed in time by a signal time delay 164. The first delayed signal input 154 may be the output of the first signal delay element 112 of FIG. 1A. A second delayed signal input 156 is shown versus time and corresponds to the signal input 152 delayed in time by two signal time delays 164. The second delayed signal input 156 may be the output of the second signal delay element 113 of FIG. 1A. A third delayed signal input 158 is shown versus time and corresponds to the signal input 152 delayed in time by three signal time delays 164. The third delayed signal input 158 may be the output of the third signal delay element 114 of FIG. 1A. A fourth delayed signal input 160 is shown versus time and corresponds to the signal input 152 delayed in time by four signal time delays 164. The fourth delayed signal input 160 may be the output of the fourth signal delay element 115 of FIG. 1A. A fifth delayed signal input 162 is shown versus time and corresponds to the signal input 152 delayed in time by five signal time delays 164. The fifth delayed signal input 162 may be the output of the fifth signal delay element 116 of FIG. 1A. Thus, in one embodiment and with reference to FIG. 1A, the signal time delay 164 is the same for each of the signal delay elements (112, 113, 114, 115, 116).

Similarly, a reference input 172 is shown versus time. The reference input 172 may be the same or similar to the reference input 110 of FIG. 1A. A first delayed reference input 174 is shown versus time and corresponds to the reference input 172 delayed in time by a reference time delay 184. The reference time delay 184 is less (i.e., faster) than the signal time delay 164. The first delayed reference input 174 may be the output of the first reference delay element 118 of FIG. 1A. A second delayed reference input 176 is shown versus time and corresponds to the reference input 172 delayed in time by two reference time delays 184. The second delayed reference input 176 may be the output of the second signal delay element 119 of FIG. 1A. A third delayed reference input 178 is shown versus time and corresponds to the reference input 172 delayed in time by three reference time delays 184. The third delayed reference input 178 may be the output of the third reference delay element 120 of FIG. 1A. A fourth delayed reference input 180 is shown versus time and corresponds to the reference input 172 delayed in time by four reference time delays 184. The fourth delayed reference input 180 may be the output of the fourth reference delay element 121 of FIG. 1A. A fifth delayed reference input 182 is shown versus time and corresponds to the reference input 172 delayed in time by five reference time delays 184. The fifth delayed reference input 182 may be the output of the fifth reference delay element 122 of FIG. 1A. Thus, in one embodiment and with reference to FIG. 1A, the reference time delay 184 is the same for each of the reference delay elements (118, 119, 120, 121, 122).

As can be seen, in a traditional time to digital converter that uses only a non-delayed reference input 172, a digital representation of a phase component of the signal input 152 can be obtained by sampling the signal input 152 and its corresponding delays (154, 156, 158, 160, 162) at a first rising edge 196 of the non-delayed reference input 172. Such operation yields a traditional digital representation 190 of:

[1 0 0 0 0 0].

In contrast, a Vernier time to digital converter that uses the reference input 172 and its corresponding delays (174, 176, 178, 180, 182) yields a Vernier digital representation 191 of

[1 1 0 0 0 0].

Thus, by propagating the reference input 172 through a delay path and using the first delayed reference input 174 for initiating the sampling of the first delayed signal input 154, the second delayed reference input 176 for initiating the sampling of the second delayed signal input 156, the third delayed reference input 178 for initiating the sampling of the third delayed signal input 158, the fourth delayed reference input 180 for initiating the sampling of the fourth delayed signal input 160 and the fifth delayed reference input 182 for initiating the sampling of the fifth delayed signal input 162, a more accurate digital representation of the phase component is obtained due to the closer proximity of the various sampling initiations to the various transitions for the signal input 152 and its corresponding delays (154, 156, 158, 160, 162). While a similar result may be obtained by using only a non-delayed reference input 172 with a substantially higher signal frequency, as the signal frequency increases so does the number of generated samples even for times not near a transition of the signal input 152 and its corresponding delays (154, 156, 158, 160, 162). This increase in junk sampling wastes processing power and substantially increases the power consumption of the circuit.

Similarly, at a second rising edge 197 of the non-delayed reference input 172, a traditional time to digital converter yields a traditional digital representation 192 of

[0 0 0 1 1 1]

compared to a Vernier digital representation 193 of

[0 0 0 0 0 1].

Likewise, at a third rising edge 198 of the non-delayed reference input 172, a traditional time to digital converter yields a traditional digital representation 194 of

[1 1 1 1 1 0]

compared to a Vernier digital representation 195 of:

[1 1 1 1 1 1].

Figure 2:
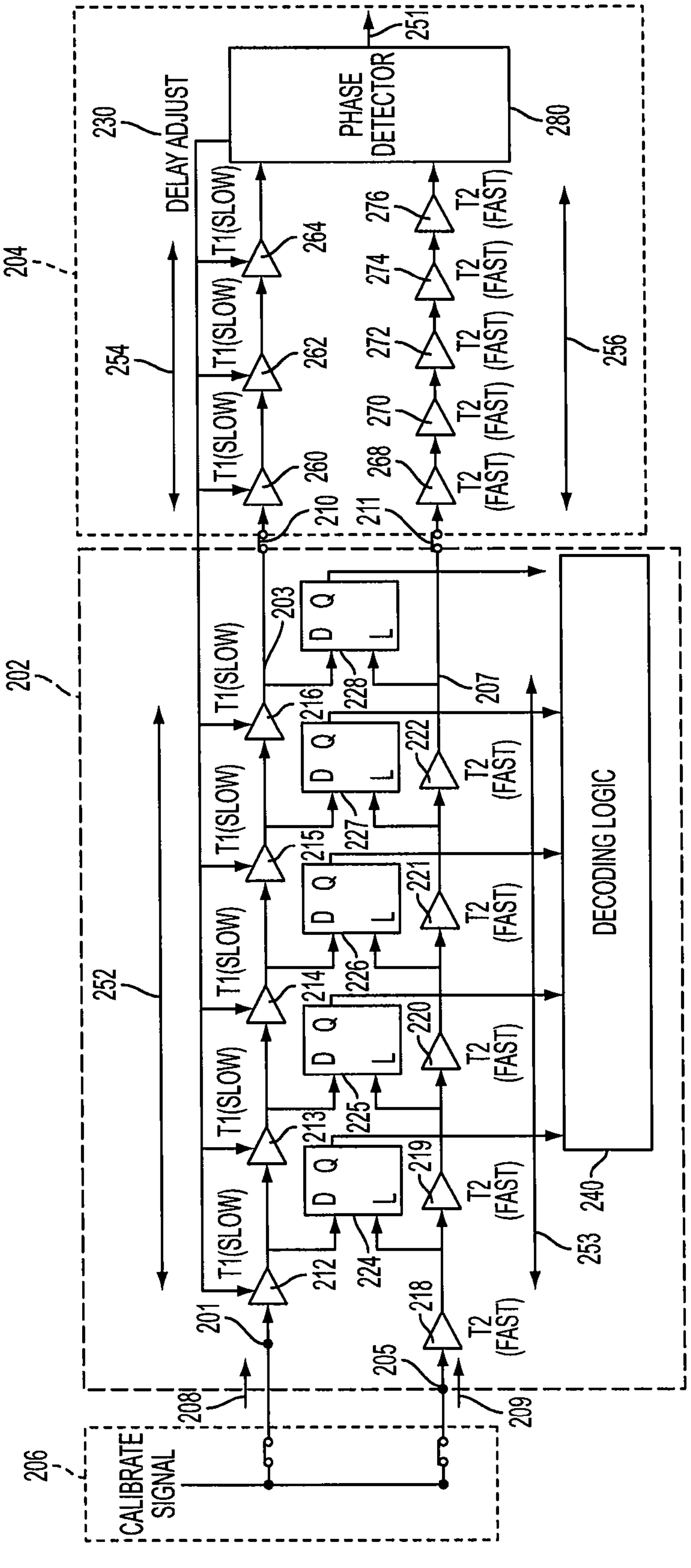
FIG. 2 is a schematic circuit diagram of a time to digital converter being automatically calibrated by a calibration circuit in accordance with an embodiment of the invention.

Turning next to FIG. 2, a schematic circuit diagram 200 shows a time to digital converter being automatically calibrated by a switchably connected calibration circuit. Generally, the schematic circuit diagram 200 may have certain configurations and features that are the same or similar to those of the schematic circuit diagram 100. Nonetheless, the schematic circuit diagram 200 shows a calibration operation for maintaining a ratio of time delays between two signal pathways, as described in greater detail herein.

The schematic circuit diagram 200 includes a time to digital portion 202, the same or similar to the time to digital portion 102 of FIG. 1A. A first circuit node 201 is electrically connected with a second circuit node 203 via a plurality of first delay elements (212, 213, 214, 215, 216) forming a first delay path 252 having a first time delay. In one embodiment, each of the plurality of first delay elements (212, 213, 214, 215, 216) may be a buffer having a first buffer delay. Similarly, a third circuit node 205 is electrically connected with a fourth circuit node 207 via a plurality of second delay elements (218, 219, 220, 221, 222) forming a second delay path 253 having a second time delay. In one embodiment, each of the plurality of second delay elements (218, 219, 220, 221, 222) may be a buffer having a second buffer delay faster than the first buffer delay. A plurality of latches (224, 225, 226, 227, 228) are electrically connected to various outputs of the first delay elements (212, 213, 214, 215, 216) and the second delay elements (218, 219, 220, 221, 222) for generating a digital representation for transmittal to a decoder 240, the same or similar as discussed for FIG. 1A.

The calibration portion 204 generates or adjusts a delay adjust signal 230 that is input to each of the first delay elements (212, 213, 214, 215, 216) for adjusting a time delay (e.g., the first buffer delay) of each of the first delay elements (212, 213, 214, 215, 216), the same or similar as previously described for FIG. 1A. The time delay of each of the first delay elements (212, 213, 214, 215, 216) or a time delay of each of the second delay elements (218, 219, 220, 221, 222) may be dependent upon current, temperature or processing methods so should be calibrated or otherwise adjusted in order to ensure proper digital representation at the output of the latches (224, 225, 226, 227, 228). The calibration portion 204 electrically connects to the time to digital portion 202 via a first switch 210 (e.g., a transistor) and a second switch 211 (e.g., a transistor). Controlling the absolute delays of the first delay elements (212, 213, 214, 215, 216) or the second delay elements (218, 219, 220, 221, 222) is difficult, so the calibration portion 204 instead operates by controlling or maintaining the ratio of the total delay for the first delay path 252 and the second delay path 253.

The calibration portion 204 includes a plurality of third delay elements (268, 270, 272, 274, 276) that form a third delay path 256 and are connected between the second switch 211 and a phase detector 280. Each of the third delay elements (268, 270, 272, 274, 276) has a time delay equal to the time delay of each of the second delay elements (218, 219, 220, 221, 222). The calibration portion 204 also includes a plurality of fourth delay elements (260, 262, 264) that form a fourth delay path 254 and are connected between the first switch 210 and the phase detector 280. Each of the fourth delay elements (260, 262, 264) has a time delay equal to the time delay of each of the first delay elements (212, 213, 214, 215, 216).

By connecting these additional delay stages in the calibration portion 204 after the first delay elements (212, 213, 214, 215, 216) and the second delay elements (218, 219, 220, 221, 222), a calibration condition may thus be established where the delay between the introduction of a calibration signal at the first circuit node 201 and its receipt at the phase detector 280 is equal to the delay between the introduction of the calibration signal at the third circuit node 205 and its receipt at the phase detector 280. Thus, the ratio of the first delay path 252 to the second delay path 253 may be maintained or adjusted to a desired or predetermined value.

For example, the first delay path 252 and the second delay path 253 may be characterized by the following equations:

$$T_{T1}=N*T_1$$

$$T_{T2}=N*T_2$$

where $T_{T1}$ is the total time delay of the first delay path 252, $T_{T2}$ is the total time delay of the second delay path 253, N is the equal number of first delay elements (212, 213, 214, 215, 216) and second delay elements (218, 219, 220, 221, 222), $T_1$ is the time delay of each of the first delay elements (212, 213, 214, 215, 216) and $T_2$ is the time delay of each of the second delay elements (218, 219, 220, 221, 222).

The second delay elements (218, 219, 220, 221, 222) each having a time delay $T_2$ are chosen according to a desired quantization factor (L) for the time to digital conversion circuit per the equation:

$$T_2=(1-1/L)*T_1.$$

Thus, for example, if a factor of four increase in phase quantization is desired and $T_1$ equals 100 ns, then $T_2$ would desirably equal 75 ns. If L is chosen to be less than N, the quantization of the converter circuit is coarse and oversampling may occur, but there are no missing or skipped digital representations or codes during the sampling of an input signal. If L is chosen to be greater than N, the quantization is fine, but there may be missing or skipped digital representations or codes during the sampling of an input signal. If L is chosen to be equal to N, the quantization is as uniform as can be made without the potential for missing or skipped digital representations or codes during the sampling of an input signal.

By adding the third delay path 256 and the fourth delay path 254, the following equations represent the total time delay for a signal input at the first circuit node 201 and the third circuit node 205:

$$T_{T14}=(N+K)*T_1 \text{ and}$$

$$T_{T23}=(N+M)*T_2$$

where $T_{T14}$ is the total time delay of the first delay path 252 added with the fourth delay path 254, $T_{T23}$ is the total time delay of the second delay path 253 added with the third delay path 256, K is the number of fourth delay elements (260, 262, 264), and M is the number of third delay elements (268, 270, 272, 274, 276). An equal delay through both paths is obtained according to the following equation:

$$(N+K)*T_1=(N+M)*T_2 \text{ and thus}$$

$$K=M*(1-1/L)-(N/L).$$

In the embodiment shown, if a quantization factor (L) of five is desired with an equal number (N) of five first delay elements (212, 213, 214, 215, 216) and second delay elements (218, 219, 220, 221, 222), then the number (K) of fourth delay elements (260, 262, 264) may be three and the number (M) of third delay elements (268, 270, 272, 274, 276) may be five. In another embodiment, the fourth time delay 254 may be substantially zero by not utilizing any additional fourth delay elements (i.e., K=0). For example, if a quantization factor (L) of six is desired with an equal number (N) of five first delay elements and the number of second delay elements, then the number (M) of third delay elements would equal three.

The phase detector 280 of the calibration portion 204 is configured to adjust the delay adjust signal 230 (e.g., by adjusting its amount of current) based on the first time delay of the first delay path 252, the second time delay of the second delay path 253, the third time delay of the third delay path 256 and the fourth time delay of the fourth delay path 254 such that the summation of the first time delay and the fourth time delay substantially equals the summation of the second time delay and the third time delay. The delay adjust signal 230 is thus automatically tuned by the phase detector 280 based on receipt at the phase detector 280 and comparison of two equivalent signals propagating along two separate delay paths. The phase detector 280 may utilize any of a variety of methods in various embodiments for comparing or otherwise determining the phase difference between the two signals. The phase detector 280 may generate the delay adjust signal 230 directly or may provide an external signal 251 to additional circuitry designed to generate the delay adjust signal 230.

In order to allow normal operation of the time to digital converter when it is not being calibrated, the calibration portion 204 is switchably coupled with the time to digital portion 202. The first switch 210 having a conducting configuration and a non-conducting configuration is electrically connected with the second circuit node 203 for switchably coupling a segment of the time to digital portion 202 to a segment of the calibration portion 204. Similarly, the second switch 211 having a conducting configuration and a non-conducting configuration is electrically connected with the fourth circuit node 207 for switchably coupling a segment of the time to digital portion 202 to a segment of the calibration portion 204. In an alternative embodiment, more or fewer switches may be utilized for providing a switchable connection to calibration circuitry.

Moreover, the first circuit node 201 and the third circuit node 205 are electrically connected with a calibration signal switching portion 206 that is configured to switchably provide a calibration signal to both the first circuit node 201 and the second circuit node 205 when a circuit utilizing the schematic circuit diagram 200 is to be calibrated. During calibration, a first calibration signal 208 is received at the first circuit node 201 and a second calibration signal 209, the same as the first calibration signal 208, is received at the third circuit node 205. In an alternative embodiment, any of a number of switching configurations may be used for providing a calibration signal to the time to digital portion 202.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A calibrating time to digital converter comprising:

a first circuit node for receiving a first signal;

a first delay path having a first time delay coupled with the first circuit node;

a second circuit node coupled with the first delay path for receiving the first signal after the first time delay;

a third circuit node for receiving a second signal;

a second delay path having a second time delay coupled with the third circuit node;

a fourth circuit node coupled with the second delay path for receiving the second signal after the second time delay; and a third delay path having a third time delay switchably coupled with the fourth circuit node for receiving the second signal after the second time delay if the third delay path is coupled with the fourth circuit node, wherein the first time delay is configured to be adjusted based on the first time delay, the second time delay and the third time delay.

2. The calibrating time to digital converter of claim 1 wherein the first signal equals the second signal.

3. The calibrating time to digital converter of claim 1 wherein the first delay path comprises at least one first buffer, each of the at least one first buffers having a first buffer delay, the first time delay of the first delay path being a summation of each of the first buffer delays for the at least one first buffer.

4. The calibrating time to digital converter of claim 3 wherein the second delay path comprises at least one second buffer, each of the at least one second buffers having a second buffer delay, the second time delay of the second delay path being a summation of each of the second buffer delays for the at least one second buffer.

5. The calibrating time to digital converter of claim 4 wherein the first buffer delay is greater than the second buffer delay.

6. The calibrating time to digital converter of claim 5 wherein the first time delay is greater than the second time delay.

7. The calibrating time to digital converter of claim 4 wherein the third delay path comprises at least one third buffer, each of the at least one third buffer having the second buffer delay, the third time delay of the third delay path being a summation of each of the second buffer delays for the at least one third buffer.

8. The calibrating time to digital converter of claim 1 further comprising a fourth delay path having a fourth time delay switchably coupled with the second circuit node for receiving the first signal after the first time delay if the fourth delay path is coupled with the second circuit node.

9. The calibrating time to digital converter of claim 8 further comprising an adjustable delay signal for adjusting the first time delay, the adjustable delay signal configured to be adjusted so that the summation of the second time delay and the third time delay substantially equals the summation of the first time delay and the fourth time delay.

10. The calibrating time to digital converter of claim 9 further comprising a phase detector coupled with the third delay path for receiving the second signal and the fourth delay path for receiving the first signal, the phase detector configured to generate the adjustable delay signal.

11. An automatic adjusting time to digital conversion circuit comprising:

a first circuit node configured to conduct a first calibration signal;

at least one first delay element electrically connected with the first circuit node and configured to delay the first calibration signal by a first time delay;

a second circuit node electrically connected with the at least one first delay element and configured to conduct the first calibration signal after the first time delay;

a first switch having a conducting configuration and a non-conducting configuration, the first switch electrically connected with the second circuit node;

a third circuit node configured to conduct a second calibration signal;

at least one second delay element electrically connected with the third circuit node and configured to delay the second calibration signal by a second time delay faster than the first time delay;

a fourth circuit node electrically connected with the at least one second delay element and configured to conduct the second calibration signal after the second time delay;

a second switch having a conducting configuration and a non-conducting configuration, the second switch electrically connected with the fourth circuit node;

at least one third delay element electrically connected with the second switch, the at least one third delay element configured to delay the second calibration signal by a third time delay when the second switch is in the conducting configuration;

at least one fourth delay element electrically connected with the first switch, the at least one fourth delay element configured to delay the first calibration signal by a fourth time delay when the first switch is in the conducting configuration; and a delay adjustment signal configured to be received by the at least one first delay element for adjusting the first time delay so that the first time delay added to the fourth time delay equals the second time delay added to the third time delay.

12. The automatic adjusting time to digital conversion circuit of claim 11 further comprising a phase detector electrically connected with the at least one third delay element and the at least one fourth delay element, the phase detector configured to automatically adjust the delay adjustment signal.

13. The automatic adjusting time to digital conversion circuit of claim 12 wherein an increase in a current level of the delay adjustment signal is configured to increase the first time delay of the at least one first delay element.

14. The automatic adjusting time to digital conversion circuit of claim 11 wherein:

the at least one first delay element comprises a plurality of first buffers, each of the plurality of first buffers having a first buffer delay, the addition of the plurality of first buffer delays equaling the first time delay;

the at least one second delay element comprises a plurality of second buffers, each of the plurality of second buffers having a second buffer delay, the addition of the plurality of second buffer delays equaling the second time delay;

the at least one third delay element comprises a plurality of third buffers, each of the plurality of third buffers having a third buffer delay equal to the second buffer delay, the addition of the plurality of third buffer delays equaling the third time delay; and the at least one fourth delay element comprises a plurality of fourth buffers, each of the plurality of fourth buffers having a fourth buffer delay equal to the first buffer delay, the addition of the plurality of fourth buffer delays equaling the fourth delay time.

15. The automatic adjusting time to digital conversion circuit of claim 14 further comprising:

at least one latch electrically connected with the at least one first delay element and the at least one second delay element; and a decoding unit electrically connected with the at least one latch and configured to decode an input received from the at least one latch.

16. The automatic adjusting time to digital conversion circuit of claim 11 wherein the first switch and the second switch are configured to be in the conducting configuration only when the delay adjustment signal is to be adjusted.

17. A method of automatically calibrating a time to digital conversion circuit, the method comprising the steps of:

providing a first delay path having a first time delay, the first delay path electrically connected between a first circuit node and a second circuit node;

providing a second delay path having a second time delay, the second delay path electrically connected between a third circuit node and a fourth circuit node;

switching a third delay path to electrically connect with the fourth circuit node, the third delay path having a third time delay;

switching a fourth delay path to electrically connect with the second circuit node, the fourth delay path having a fourth time delay;

generating a delay adjustment signal based upon the combination of the first time delay and the fourth time delay and the combination of the second time delay and the third time delay; and calibrating the first time delay of the first delay path based on the delay adjustment signal.

18. The method of claim 17 wherein the first delay path includes one or more first buffers, the second delay path includes one or more second buffers, the third delay path includes one or more third buffers and the fourth delay path includes one or more fourth buffers.

19. The method of claim 17 wherein the first time delay is calibrated by the delay adjustment signal so that the combination of the first time delay and the fourth time delay is substantially the same as the combination of the second time delay and the third time delay.

20. The method of claim 17 further comprising the step of switching a calibration signal to the first circuit node and to the second circuit node when the first time delay of the first delay path is to be calibrated.

* * * * *